(12) United States Patent
Taylor et al.

(10) Patent No.: US 7,038,625 B1
(45) Date of Patent: May 2, 2006

(54) ARRAY ANTENNA INCLUDING A MONOLITHIC ANTENNA FEED ASSEMBLY AND RELATED METHODS

(75) Inventors: Robert C. Taylor, Melbourne, FL (US); William F. Croswell, Melbourne, FL (US); Ronald J. Hash, Rogersville, TN (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 11/035,533

(22) Filed: Jan. 14, 2005

(51) Int. Cl.
*H01Q 1/38* (2006.01)

(52) U.S. Cl. ............................................. 343/700 MS

(58) Field of Classification Search ......... 343/700 MS, 343/824, 893, 830
See application file for complete search history.

(56) References Cited

U.S. PATENT DOCUMENTS

| | | | |
|---|---|---|---|
| 6,211,824 B1 * | 4/2001 | Holden et al. ....... | 343/700 MS |
| 6,292,141 B1 * | 9/2001 | Lim ..................... | 343/700 MS |
| 6,483,464 B1 | 11/2002 | Rawnick et al. ..... | 343/700 MS |
| 6,512,487 B1 | 1/2003 | Taylor et al. ............... | 343/795 |
| 6,639,558 B1 * | 10/2003 | Kellerman et al. .. | 343/700 MS |
| 2004/0090369 A1 * | 5/2004 | McCarrick ........... | 343/700 MS |

* cited by examiner

*Primary Examiner*—Don Wong
*Assistant Examiner*—Huedung X. Cao
(74) *Attorney, Agent, or Firm*—Allen, Dyer, Doppelt, Milbrath & Gilchrist, P.A.

(57) ABSTRACT

An antenna includes antenna elements, an antenna feed assembly and at least one integrated circuit adjacent the antenna feed assembly on a side thereof opposite the antenna elements. The at least one integrated circuit is connected to the antenna elements via the antenna feed assembly. The antenna feed assembly includes a conductive base plate spaced from the antenna elements, and has feed openings therein. Spaced apart conductive posts are integrally formed with the conductive base plate as a monolithic unit, and extend outwardly therefrom toward the antenna elements. Each conductive post has at least one passageway therethrough aligned with at least one respective feed opening to define at least one antenna feed passageway. A respective elongated feed conductor extends through each antenna feed passageway.

35 Claims, 4 Drawing Sheets

ARRAY ANTENNA INCLUDING A MONOLITHIC ANTENNA FEED ASSEMBLY AND RELATED METHODS

FIELD OF THE INVENTION

The present invention relates to the field of communications, and more particularly, to phased array antennas.

BACKGROUND OF THE INVENTION

Existing phased array antennas include a wide variety of configurations for various applications, such as satellite reception and remote broadcasting. The desirable characteristics of low cost, light-weight, low profile and mass producibility are provided in general by printed circuit antennas. Printed circuit antennas are defined by flat conductive elements spaced from a single, essentially continuous ground element by a dielectric sheet of uniform thickness.

While a printed circuit antenna is advantageous in applications requiring a conformal configuration, e.g., in aerospace systems, mounting the antenna presents challenges. One of these challenges is with respect to the manner in which it is fed such that conformality and satisfactory radiation coverage and directivity are maintained and losses to surrounding surfaces are reduced.

An antenna feed assembly for a phased array antenna with a wide frequency bandwidth and a wide scan angle is disclosed in U.S. Pat. No. 6,483,464. The '464 patent is assigned to the current assignee of the present invention, and is incorporated herein by reference in its entirety. In particular, this antenna can be conformally mounted to a surface, and the antenna feed assembly includes a respective feed line organizer body having passageways therein for receiving the respective coaxial feed lines for a corresponding antenna element. Each respective feed line organizer body is individually coupled to the ground plane using four screws. Although this patent discloses a significant advance in such antennas, individually coupling the feed line organizer bodies to the ground plane is a tedious and time consuming process, especially when the phased array antenna includes a large number of antenna elements. In addition, manufacturing costs may be increased as a result of this process.

SUMMARY OF THE INVENTION

In view of the foregoing background, it is therefore an object of the present invention to provide an array antenna that is relatively straightforward to produce, particularly with respect to the antenna feed assembly.

This and other objects, features, and advantages in accordance with the present invention are provided by an antenna comprising a plurality of antenna elements, an antenna feed assembly, and at least one integrated circuit adjacent the antenna feed assembly on a side thereof opposite the antenna elements and connected thereto via the antenna feed assembly.

The antenna feed assembly may comprise a conductive base plate spaced from the plurality of antenna elements, and the conductive base plate has a plurality of feed openings therein. A plurality of spaced apart conductive posts are integrally formed with the conductive base plate as a monolithic unit, and extend outwardly therefrom toward the plurality of antenna elements. Each conductive post may have at least one passageway therethrough aligned with at least one respective feed opening in the conductive base plate to define at least one antenna feed passageway. A respective elongated feed conductor may extend through each antenna feed passageway.

The conductive base plate functions as a ground plane for the plurality of antenna elements. Since each conductive post is integrally formed with the conductive base plate as a monolithic unit, this advantageously allows the antenna feed assembly to be formed in a relatively straightforward manner. For example, the antenna feed assembly may be machined from a block of conductive material. The cost of an antenna with an antenna feed assembly machined from a block of conductive material may be significantly reduced. Moreover, since the conductive posts and the conductive base plate are formed as a monolithic unit, the antenna feed assembly is more reliable, particularly during periods of extreme vibration.

The plurality of antenna elements may comprise first and second sets of orthogonal antenna elements to provide dual polarization. For a dual polarization, each conductive post has four passageways for interfacing with a respective first and second set of orthogonal antenna elements.

The antenna may further comprise a dielectric layer between the plurality of antenna elements and the conductive base plate. The antenna has a desired frequency range, and the dielectric layer has a thickness that is equal to or less than one-half a wavelength of a highest desired frequency.

The at least one integrated circuit may comprise a plurality of active Balun integrated circuits. The active Balun integrated circuits advantageously provide impedance matching with the antenna elements. In addition, the Baluns replace the 0/180 degree hybrid circuits normally used with this type of antenna—which resulted in a 3 dB power loss. Moreover, in addition to overcoming this power loss, the Balun integrated circuits may also comprise low noise amplifiers.

The antenna may further comprise a beam forming network layer coupled to the active Balun integrated circuits so that the antenna is a phased array antenna. The beam forming network layer is based upon strip lines sandwiched between ground planes, and replaces the coaxial cables normally associated with this type of antenna. The advantages are two-fold. First, the thickness of the beam forming network layer is smaller by about a factor of six as compared to the use of coaxial cables. Second, the strip lines help to dissipate heat away from the antenna elements and the active Balun integrated circuits.

The antenna may further comprise at least one time delay integrated circuit coupled to the beam forming network layer. The time delay integrated circuits may be programmable to define a scan angle of about ±50 degrees.

The antenna may further comprise a power and control distribution network layer coupled to the active Balun integrated circuits and the beam forming network layer. The array of antenna elements is sized and relatively positioned so that the antenna is operable over a frequency range of 2 to 18 GHz. The antenna has an overall thickness that is less than or equal to about 1 inch.

Another aspect of the present invention is directed to a method for making an antenna as described above. The method comprises forming a plurality of antenna elements, forming an antenna feed assembly, and connecting at least one integrated circuit to the plurality of antenna elements via the antenna feed assembly. The at least one integrated circuit may be adjacent the antenna feed assembly on a side thereof opposite the plurality of antenna elements.

More particularly, forming the antenna feed assembly comprises forming a conductive base plate spaced from the plurality of antenna elements and having a plurality of feed openings therein, and forming as a monolithic unit a plurality of spaced apart conductive posts with the conductive base plate. The plurality of spaced apart conductive posts extend outwardly from the conductive base plate toward the plurality of antenna elements. Each conductive post may have at least one passageway therethrough aligned with at least one respective feed opening to define at least one antenna feed passageway connecting the at least one integrated circuit to the plurality of antenna elements via the antenna feed assembly.

DETAILED DESCRIPTION OF THE
PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
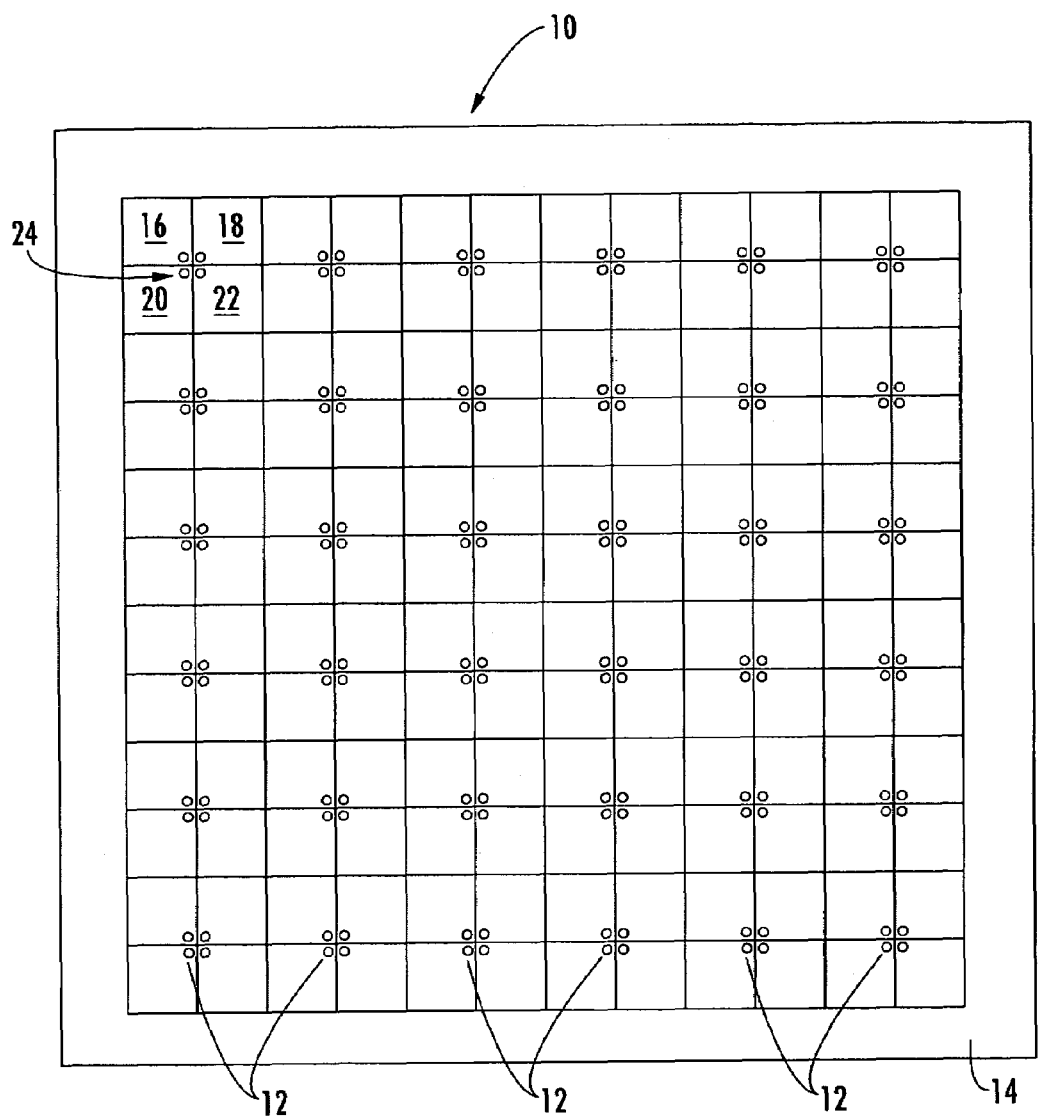
FIG. 1 is a top schematic plan view of a dual polarization phased array antenna in accordance with the present invention.
Figure 2:
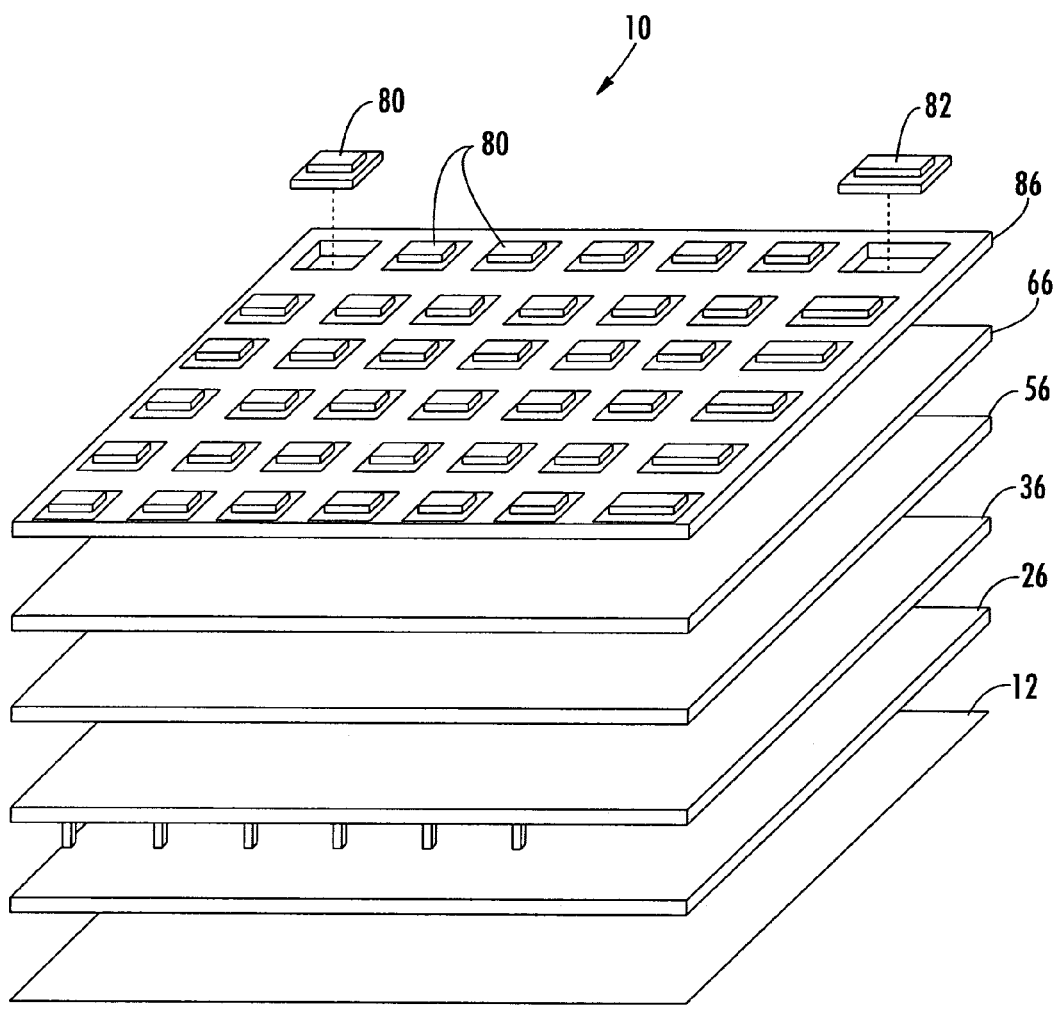
FIG. 2 is an exploded perspective view of the dual polarization phased array antenna illustrated in FIG. 1.
Figure 4:
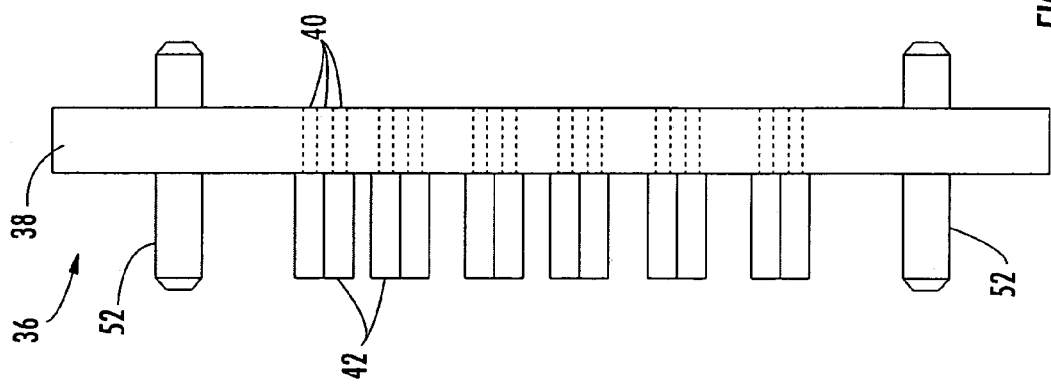
FIG. 4 is a side view of the antenna feed assembly illustrated in FIG. 2.
Figure 3:
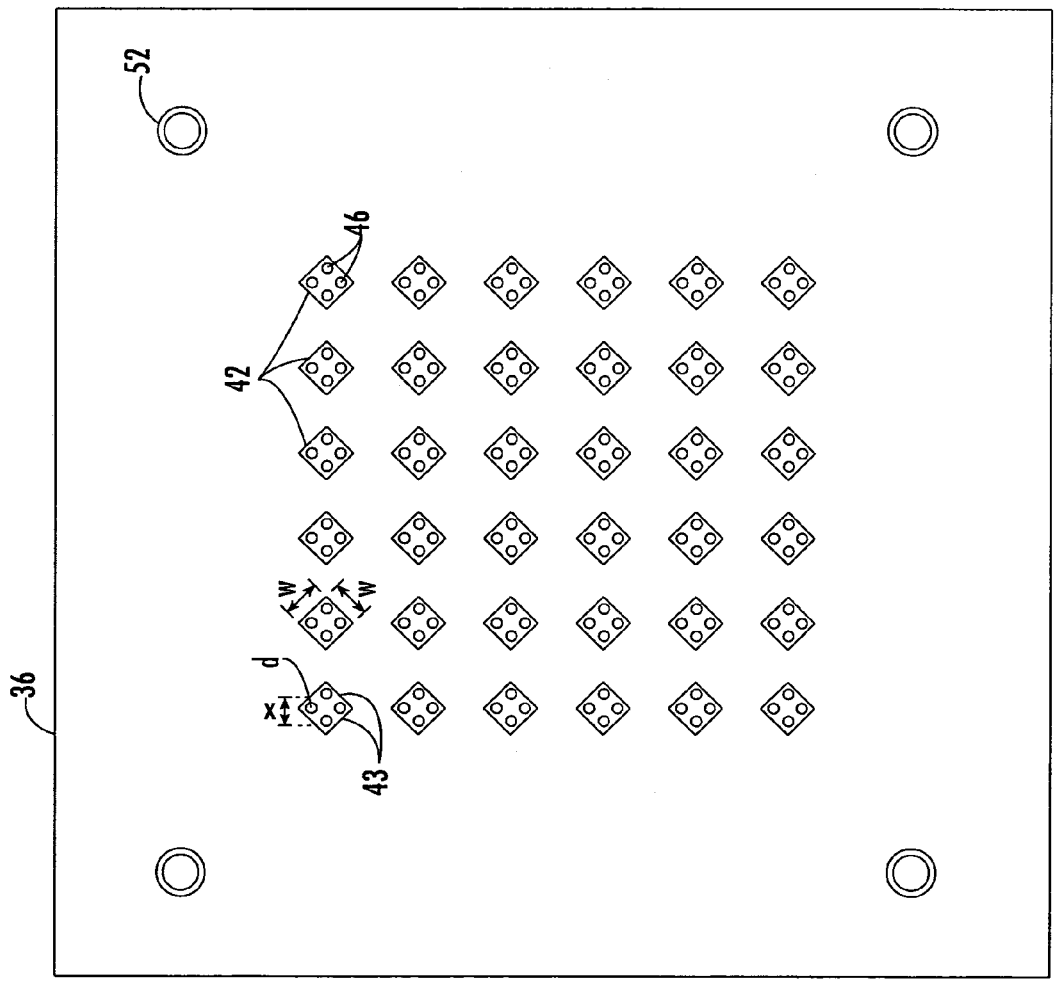
FIG. 3 is a top plan view of the antenna feed assembly illustrated in FIG. 2.

Referring initially to FIG. 1, an antenna 10 according to the invention includes a plurality of antenna units 12 arranged in an array. The illustrated antenna 10 includes 36 antenna units 12 formed on a printed conductive sheet 14, where each antenna unit includes four adjacent dipole antenna elements 16, 18, 20, 22 arranged in a spaced apart relation from one another about a central feed position 24. The 36 antenna units 12 are for illustrative purposes only, and the antenna 10 may include a larger number of antenna units, such as 250 or more, for example.

The four adjacent antenna elements 16–22 for each antenna unit 12 may be arranged as first and second sets of orthogonal antenna elements, e.g., 16/22 and 18/20, to provide dual polarization. Of course, only a single pair of antenna elements, e.g., 16/22, may be used to provide for a single polarization embodiment.

The array of antenna units 12 are sized and relatively positioned so that the antenna 10 is operable over a desired frequency range, such as 2 to 18 GHz, for example, which is a 9:1 bandwidth. Of course, the antenna units 12 may be sized and positioned to support other frequency bands, including frequency bands with a larger bandwidth. For a more detailed discussion on the different features and embodiments of the antenna units, reference is directed to U.S. Pat. No. 6,512,487. The '487 patent discloses dipole antenna elements and is assigned to the current assignee of the present invention, and is incorporated herein by reference in its entirety.

The antenna 10 will now be discussed with reference to FIGS. 2–5. The antenna 10 is made up of a plurality of layers. The different layers are fabricated by standard PCB techniques, and the antenna 10 can be conformally mounted to a desired surface as readily appreciated by those skilled in the art. The outermost layer is the array of antenna units 12 carried by the printed conductive sheet 14. A dielectric layer 26 is between the printed conductive sheet 14 and an antenna feed assembly 36. The dielectric layer 26 has a thickness that is typically equal to or less than about one-half a wavelength of a highest desired frequency, e.g., 18 GHz.

The antenna feed assembly 36 comprises a conductive base plate 38 spaced from the array of antenna elements 16–22, and the conductive base plate has a plurality of feed openings 40 therein. A plurality of spaced apart conductive posts 42 are integrally formed with the conductive base plate 38 as a monolithic unit, and extend outwardly therefrom toward the plurality of antenna elements 16–22. Each conductive post 42 has a plurality of passageways therethrough 46 that are aligned with a plurality of respective feed opening 40 in the conductive base plate 38 to define a plurality of antenna feed passageways.

A respective elongated feed conductor 50 extends through each antenna feed passageway. For dual polarization, each conductive post 42 has four passageways 46 therethrough for interfacing with a respective first and second set of orthogonal antenna elements 16/22 and 18/20, and a respective elongated feed conductor 50 extends through each passageway 46. A distance that each conductive post 42 extends from the conductive base plate 38 is based on the highest operating frequency of the antenna 10, i.e., one-half the wavelength of the highest desired frequency. The thickness of the dielectric layer 24 and the distance the conductive posts 42 extend from the conductive base plate 38 are substantially equal.

The conductive base plate 38 functions as a ground plane for the plurality of antenna elements 16–22. Since each conductive post 42 is integrally formed with the conductive base plate 38 as a monolithic unit, this advantageously allows the antenna feed assembly 36 to be formed in a relatively straightforward manner. For example, the antenna feed assembly 36 may be machined from a solid block of conductive material, such as brass.

The cost of an antenna 10 with an antenna feed assembly 36 that is machined from a solid block of conductive material may be significantly reduced. The weight is also reduced. Moreover, since the conductive posts 42 and the conductive base plate 38 are formed as a monolithic unit, the antenna feed assembly 36 is more reliable, particularly during periods of extreme vibration. The common mode normally associated with multiple feed structures is also reduced.

Each conductive post 42 is illustrated as being rectangular shaped, although other shapes are acceptable. An example diameter d of each respective passageway 46 therethrough is 0.028 inches. An example distance x between a center of any two passageways 46 is 0.048 inches. A corresponding width w of the sides 43 of each conductive post 42 is 0.100 inches. The antenna feed assembly 36 also includes a plurality of alignment posts 52 used in assembling together the plurality of layers of the antenna 10.

Figure 5:
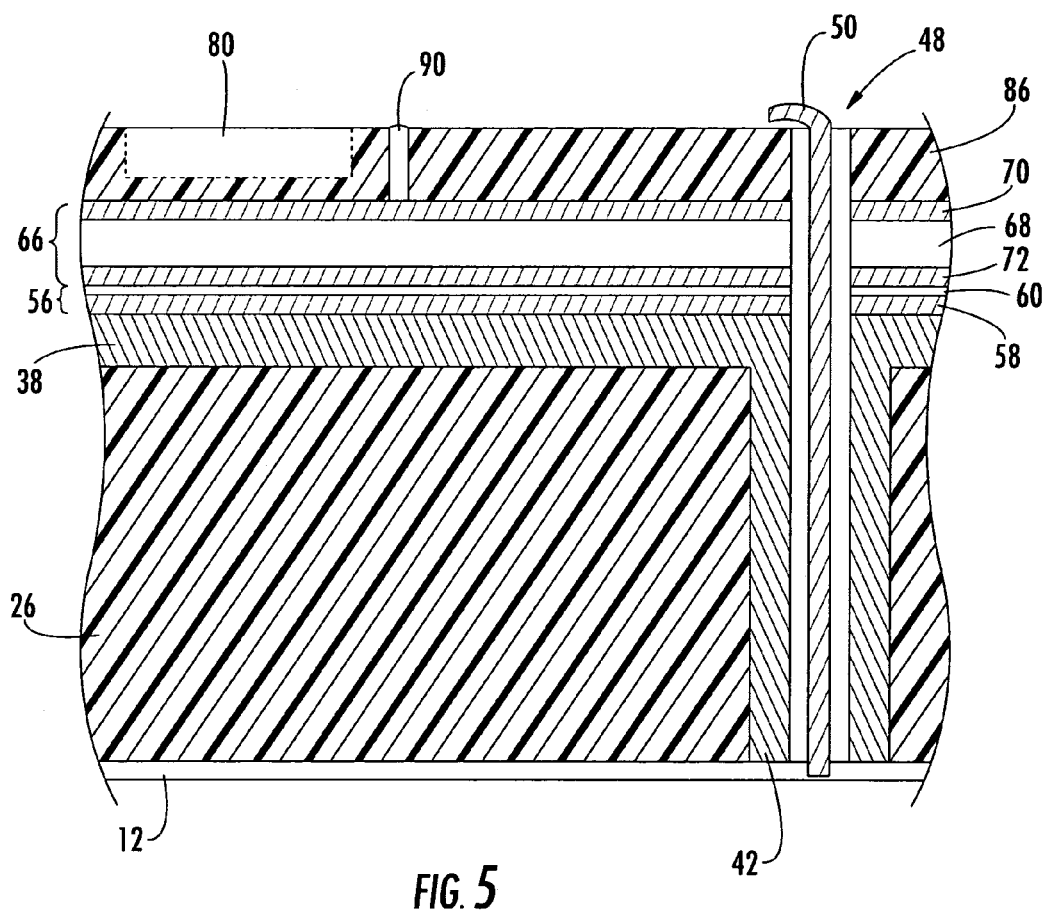
FIG. 5 is a partial cross-sectional side view of the phase array antenna in accordance with the present invention.

A DC power and control distribution network layer 56 is adjacent the antenna feed assembly 36. The DC power and control distribution network layer 56 includes a ground plane 58 and typically 2 or more DC/control layers 60, as best illustrated in FIG. 5.

A beam forming network layer 66 is adjacent the DC power and control distribution network layer 56, and a plurality of integrated circuits 80 are connected to the beam forming network layer so that the antenna 10 is a phased array antenna. The beam forming network layer 66 includes couplers, i.e., a summing network, for summing the signals from the antenna elements 16–22. The beam forming network layer 66 is based upon strip lines 68 sandwiched between ground planes 70 and 72, as illustrated in FIG. 5, and replaces the coaxial cables normally associated with this type of antenna. The advantages are two-fold. First, the thickness of the beam forming network layer 66 is smaller by about a factor of six as compared to the use of coaxial cables. Second, the strip lines help to dissipate heat away from the antenna elements 16–22 and the integrated circuits 80.

The integrated circuits 80 comprise a plurality of active MMIC Balun integrated circuits. The Balun integrated circuits 80 advantageously provide impedance matching, e.g., 50 ohms, between the antenna elements 16–22 and the beam forming network layer 66. Each Balun integrated circuit may further comprise a low noise amplifier for amplifying signals. There is an active Balun integrated circuit 80 for each antenna unit 12.

In addition, the Balun integrated circuits 80 replace the 0/180 degree hybrid circuits normally used with this type of antenna. The 0/180 degree hybrid circuits are passive devices, and there was typically a 3 dB power loss associated with these circuits. Not only do the active MMIC Balun integrated circuits 80 avoid this 3 dB power loss, but they also reduce the effects of any loses associated with the strip lines 68 in the beam forming network layer 66. Insertion loss is also reduced and the active Balun integrated circuits 80 also provide an improved noise figure because of the low noise amplifiers included therein.

The antenna 10 may further comprise a plurality of time delay integrated circuits 82 coupled to the beam forming network layer 66. The time delay integrated circuits add up in phase all the signals arriving at each individual antenna element 16–22. The time delay integrated circuits 82 may be programmable so that the phased array antenna is operable over a scan angle of about ±50 degrees, for example. The time delay integrated circuits 82 may be 6 bit integrated circuits, for example. A ribbon 90 connects the integrated circuits 80, 82 to the DC power and control distribution network layer 56.

The illustrated antenna 10 is compact, and has an overall thickness that is less 1 inch, and more particularly, is about 0.7 inches. The 0.7 inches overall thickness is based upon the integrated circuits 80, 82 being recessed within the dielectric layer 86 carrying the integrated circuits so that the upper surface of these integrated circuits is flush with the upper surface of the dielectric layer.

Another aspect of the present invention is directed to a method for making an antenna 10 as described above. The method comprises forming a plurality of antenna elements 16–22, forming an antenna feed assembly 36, and connecting at least one integrated circuit 80 to the plurality of antenna elements via the antenna feed assembly. The at least one integrated circuit 80 is adjacent the antenna feed assembly 36 on a side thereof opposite the plurality of antenna elements 16–22.

More particularly, forming the antenna feed assembly 36 comprises forming a conductive base plate 38 spaced from the plurality of antenna elements 16–22 and having a plurality of feed openings 40 therein, and forming as a monolithic unit a plurality of spaced apart conductive posts 42 with the conductive base plate. The plurality of spaced apart conductive posts 42 extend outwardly from the conductive base plate 38 toward the plurality of antenna elements 16–22. Each conductive post 42 has at least one passageway 46 therethrough aligned with at least one respective feed opening 40 to define at least one antenna feed passageway connecting the at least one integrated circuit 80 to the plurality of antenna elements 16–22 via the antenna feed assembly 36.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

What is claimed is:

1. An antenna comprising:
   a plurality of antenna elements;
   an antenna feed assembly comprising
      a conductive base plate spaced from said plurality of antenna elements and having a plurality of feed openings therein,
      a plurality of spaced apart conductive posts integrally formed with said conductive base plate as a monolithic unit and extending outwardly therefrom toward said plurality of antenna elements, each conductive post having at least one passageway therethrough aligned with at least one respective feed opening to define at least one antenna feed passageway, and
      a respective elongated feed conductor extending through each antenna feed passageway; and
   at least one integrated circuit adjacent said antenna feed assembly on a side thereof opposite said plurality of elements and connected thereto via said antenna feed assembly.

2. An antenna according to claim 1 wherein said at least one integrated circuit comprises a plurality of active Balun integrated circuits.

3. An antenna according to claim 1 wherein said at least one integrated circuit comprises an amplifier.

4. An antenna according to claim 1 further comprising a beam forming network layer coupled to said at least one integrated circuit.

5. An antenna according to claim 4 further comprising at least one time delay integrated circuit coupled to said beam forming network layer.

6. An antenna according to claim 5 wherein said at least one time delay integrated circuit is programmable to define a scan angle of about ±50 degrees.

7. An antenna according to claim 1 further comprising a power and control distribution network layer coupled to said at least one integrated circuit.

8. An antenna according to claim 1 wherein each of said conductive posts has a rectangular shape.

9. An antenna according to claim 1 wherein said plurality of antenna elements comprises a plurality of first and second sets of orthogonal antenna elements to provide dual polarization; and wherein each conductive post has four passageways for interfacing with a respective first and second set of orthogonal antenna elements.

10. An antenna according to claim 1 further comprising a dielectric layer between said plurality of antenna elements and said conductive base plate.

11. An antenna according to claim 10 wherein the antenna has a desired frequency range; and wherein said dielectric layer has a thickness less than about one-half a wavelength of a highest desired frequency.

12. An antenna according to claim 1 wherein said array of antenna elements are sized and relatively positioned so that the antenna is operable over a frequency range of 2 to 18 GHz.

13. An antenna according to claim 1 wherein the antenna has a thickness less than or equal to about 1 inch.

14. A phased array antenna comprising:
a plurality of antenna elements;
an antenna feed assembly comprising
    a conductive base plate spaced from said plurality of antenna elements and having a plurality of feed openings therein,
    a plurality of spaced apart conductive posts integrally formed with said conductive base plate as a monolithic unit and extending outwardly therefrom toward said plurality of antenna elements, each conductive post having at least one passageway therethrough aligned with at least one respective feed opening to define at least one antenna feed passageway, and
    a respective elongated feed conductor extending through each antenna feed passageway;
a beam forming network layer adjacent said antenna feed assembly on a side thereof opposite said plurality of elements; and
at least one Balun integrated circuit connected to said beam forming network layer and connected to said plurality of antenna elements via said antenna feed assembly.

15. A phased array antenna according to claim 14 wherein said at least one Balun integrated circuit comprises a plurality of active Balun integrated circuits.

16. A phased array antenna according to claim 14 wherein said at least one Balun integrated circuit comprises an amplifier.

17. A phased array antenna according to claim 14 further comprising at least one time delay integrated circuit coupled to said beam forming network layer.

18. A phased array antenna according to claim 17 wherein said at least one time delay integrated circuit is programmable to define a scan angle of about ±50 degrees.

19. A phased array antenna according to claim 14 further comprising a power and control distribution network layer coupled to said at least one integrated circuit and said beam forming network layer.

20. A phased array antenna according to claim 14 wherein each of said conductive posts has a rectangular shape.

21. A phased array antenna according to claim 14 wherein said plurality of antenna elements comprises a plurality of first and second sets of orthogonal antenna elements to provide dual polarization; and wherein each conductive post has four passageways for interfacing with a respective first and second set of orthogonal antenna elements.

22. A phased array antenna according to claim 14 further comprising a dielectric layer between said plurality of antenna elements and said conductive base plate.

23. A phased array antenna according to claim 22 wherein the phased array antenna has a desired frequency range; and wherein said dielectric layer has a thickness less than about one-half a wavelength of a highest desired frequency.

24. A phased array antenna according to claim 14 wherein said array of antenna elements are sized and relatively positioned so that the phased array antenna is operable over a frequency range of 2 to 18 GHz.

25. A method for making an antenna comprising:
forming a plurality of antenna elements;
forming an antenna feed assembly comprising
    forming a conductive base plate spaced from the plurality of antenna elements and having a plurality of feed openings therein,
    forming as a monolithic unit a plurality of spaced apart conductive posts with the conductive base plate, the plurality of spaced apart conductive posts extending outwardly from the conductive base plate toward the plurality of antenna elements, each conductive post having at least one passageway therethrough aligned with at least one respective feed opening to define at least one antenna feed passageway, and
    extending a respective elongated feed conductor through each antenna feed passageway; and
connecting at least one integrated circuit to the plurality of antenna elements via the antenna feed assembly, the at least one integrated circuit being adjacent the antenna feed assembly on a side thereof opposite the plurality of elements.

26. A method according to claim 25 wherein the at least one integrated circuit comprises a plurality of active Balun integrated circuits.

27. A method according to claim 25 wherein the at least one integrated circuit comprises an amplifier.

28. A method according to claim 25 further comprising coupling a beam forming network layer to the at least one integrated circuit.

29. A method according to claim 28 further comprising coupling at least one time delay integrated circuit to the beam forming network layer.

30. A method according to claim 29 further comprising programming the at least one time delay integrated circuit to define a scan angle of about ±50 degrees.

31. A method according to claim 25 further comprising coupling a power and control distribution network layer to the at least one integrated circuit.

32. A method according to claim 25 wherein the plurality of antenna elements comprise a plurality of first and second sets of orthogonal antenna elements to provide dual polarization; and wherein each conductive post has four passageways for interfacing with a respective first and second set of orthogonal antenna elements.

33. A method according to claim 25 further comprising forming a dielectric layer between the plurality of antenna elements and the conductive base plate.

34. A method according to claim 33 wherein the antenna has a desired frequency range; and wherein the dielectric layer has a thickness less than about one-half a wavelength of a highest desired frequency.

35. A method according to claim 25 wherein the array of antenna elements are sized and relatively positioned so that the antenna is operable over a frequency range of 2 to 18 GHz.

* * * * *